United States Patent [19]
Demeritt et al.

[11] Patent Number: 5,418,700
[45] Date of Patent: May 23, 1995

[54] LASER LIGHT SOURCE MODULE AND METHOD

[75] Inventors: Jeffery A. Demeritt, Painted Post; Mark L. Morrell, Horseheads, both of N.Y.

[73] Assignee: Corning Incorporated, Corning, N.Y.

[21] Appl. No.: 916,603

[22] Filed: Jul. 22, 1992

[51] Int. Cl.⁶ .............................................. F21K 7/00
[52] U.S. Cl. .................................. 362/259; 362/267; 362/294; 362/310; 362/455; 362/800; 372/36; 372/101
[58] Field of Search ............... 362/259, 267, 335, 455, 362/456, 310, 800, 294, 373; 372/34, 36, 92, 101

[56] References Cited

U.S. PATENT DOCUMENTS

| | | | |
|---|---|---|---|
| 4,362,819 | 12/1982 | Olszewski et al. | 501/44 |
| 4,391,915 | 7/1983 | Meden-Piesslinger et al. | 501/48 |
| 4,447,550 | 5/1984 | Leroy et al. | 501/75 |
| 4,697,880 | 10/1987 | Angerstein et al. | 362/259 |
| 4,923,281 | 5/1990 | Krichever et al. | 350/245 |
| 4,941,072 | 7/1990 | Yasumoto et al. | 362/335 |
| 5,111,476 | 5/1992 | Hollenbeck et al. | 372/107 |
| 5,121,188 | 6/1992 | Patridge et al. | 357/74 |
| 5,210,650 | 5/1993 | O'Brien et al. | 372/36 |
| 5,216,730 | 6/1993 | Demeritt et al. | 385/33 |
| 5,274,502 | 12/1993 | Demeritt et al. | 359/642 |

FOREIGN PATENT DOCUMENTS

| | | | |
|---|---|---|---|
| 2900356 | 7/1979 | Germany | 372/36 |
| 168024 | 10/1983 | Japan | 372/36 |

*Primary Examiner*—Ira S. Lazarus
*Assistant Examiner*—Alan B. Cariaso
*Attorney, Agent, or Firm*—K. van der Sterre

[57] ABSTRACT

A light source module for generating collimated laser light wherein a solid-state laser light source is mounted within the bore of an optical mounting tube at a preselected distance from the light output end of the tube, and a convergent glass lens within a metal lens mounting is permanently attached to the output end of the tube, lens attachment being at a location insuring permanent and accurate alignment of the collimated light output from the laser with the bore axis of the mounting tube, and a method for making it, are described.

14 Claims, 1 Drawing Sheet

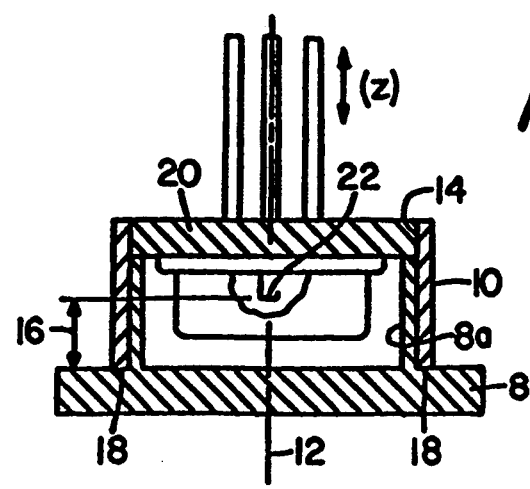
Fig. 1
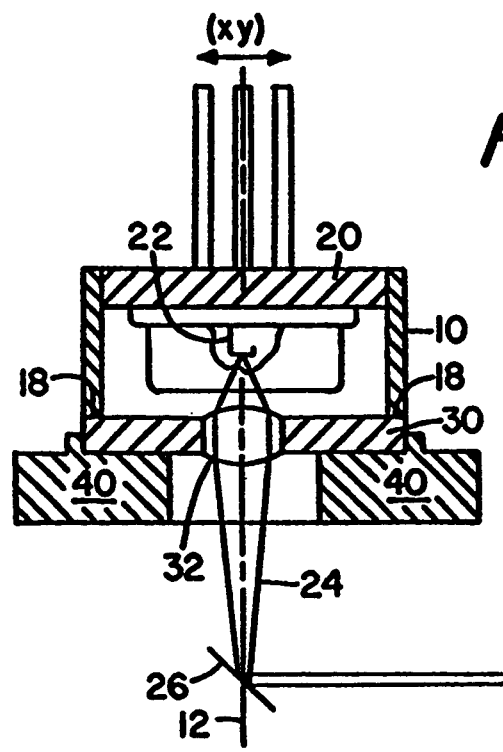
Fig. 2
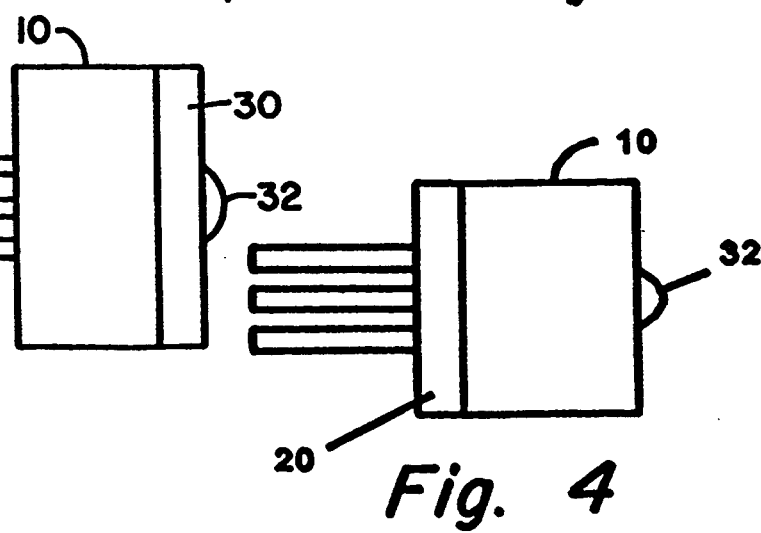
Fig. 3
Fig. 4

LASER LIGHT SOURCE MODULE AND METHOD

BACKGROUND OF THE INVENTION

The present invention relates generally to opto-electronic light sources. More particularly, the invention relates to optical source modules and a method for making them, the modules comprising a semiconductor laser light source and a collimating or focusing lens element combined into a compact and efficient photonic (optical) source module. The module offers the advantages of simple but rugged construction in combination with controlled and reproducible light output characteristics. These advantages stem from the method of construction employed, which offers economical and rapid but accurate permanent alignment of the optical source and lens elements of the modules.

Opto-electronic light sources incorporating laser diodes are well known, being used extensively in applications such as bar code scanners. U.S. Pat. No. 4,923,281, for example, describes a laser diode focusing module useful for bar code scanning applications wherein the output from a semiconductor laser diode is collimated and clipped by a combination of a convergent lens and a mask or stop to provide a laser beam of controlled alignment and shape.

However, these and other existing designs for collimated laser source modules are expensive to produce and exhibit output characteristics which are somewhat variable and hard to control. The use of lens retaining springs and multi-part housing components, in particular, increases manufacturing cost and limits the maximum device reproducibility and physical durability which may be achieved.

It is therefore a principal object of the present invention to provide an optical source module which is both simple in design and rugged in construction.

It is a further object of the invention to provide optical source module designs which offer optical beam characteristics which are consistent and repeatable.

It is a further object of the invention to provide a method for manufacturing an optical source module of improved quality at reduced cost.

Other objects and advantages of the invention will become apparent from the following description thereof.

SUMMARY OF THE INVENTION

The present invention provides a solid state (semiconductor laser) light source module, fabricated using a reduced number of metal components and a lens element composed of glass which is thermally and chemically compatible with the metals used. The module features a simplified construction offering improved device durability and stable operation in use. The invention further provides a method for fabricating the light source module, characterized in that the compatible metal and glass components are assembled by a procedure which permits accurate and repeatable permanent optical alignment of the components used.

Careful selection of compatible glass and metal materials provides a subassembly wherein collimation and beam alignment from a solid state light source such as a laser diode are much less affected by temperature changes than where conventional fabrication materials are used. Hence, in the present designs, thermal changes in the location of the light source and/or lens focal parameters are substantially offset by concomitant changes in the dimensions of the metal components of the device. Thus changes in the degree of collimation and/or the alignment of the collimated beam are advantageously reduced.

In a first aspect, then, the invention includes a light source module providing a directed and collimated light beam from a solid-state laser light source. The module includes a metal optical mounting tube having a central bore with, for optical reference, a optical source end and an optical output end. Mounted on the tube are (i) a convergent lens sealed into a central aperture in a metal lens mounting and (ii) a solid-state laser light source. The lens mounting and convergent lens are affixed to the optical mounting tube at the output end thereof, and the solid-state light source is affixed to tube at the opposite or source end.

In order to achieve the advantages of economical fabrication and stable and repeatable device operation, the design of the module is such that at least one of the lens and light source components is attached to the mounting tube at points on or proximate to the sidewall of the mounting tube, most preferably the inner sidewall thereof. This design feature permits easy adjustment of the relative positions of the lens and light source along the central bore axis of the mounting tube, which is generally the optical or so-called z-axis of the device. In the preferred embodiment of the invention, the laser light source is the component which is attached in this manner.

The other of the lens and light source components is attached to the tube at points lying exteriorly of the tube bore, that is, at points on or proximate to the tube endface. This mode of attachment permits easy adjustment of the lateral position of the component with respect to the tube, such adjustment being termed x-y positioning since it is an alignment of the component in the x-y plane orthogonal to the optical or z-axis of the device. Either the light source or, more preferably, the lens and lens mounting are attached to the tube in this manner.

In a second aspect, the invention comprises a method for making an optical source module such as above described. In accordance with that method a metal optical mounting tube having an source end, an output end, and a longitudinal bore is first provided, and a solid-state laser light source having an active laser junction is placed within the source end of the tube. The laser is positioned such that the active laser junction is situated on or proximate to a central bore axis of the tube, this axis becoming, for reference, the optical axis of the device. At this time the position of the laser is also fixed at a preselected distance from the output end of the tube, and is then permanently fastened to tube sidewall, by laser welding or the like.

After attachment of the laser, the output end of the tube is next brought into contact or close proximity with a metal lens mounting, the lens mounting having a central aperture within which is sealed a convergent glass lens. Typically, this lens has an optical axis at or near the center thereof. While in proximity with each other the position of the mounting tube is adjusted relative to the lens such that the optical axis of the lens is substantially congruent with the bore axis, ie., the optical axis of the device. The mounting tube and lens mounting are then permanently joined, as by welding the mounting tube to the lens mount.

The product of the above-described process is a light source module which is both rugged in construction and consistent in terms of collimation quality and other light output characteristics. These factors, together with the repeatability and overall economy of the module and the process for making it, represent a significant advance in the art of manufacturing collimated light sources of the kind described.

BRIEF DESCRIPTION OF THE DRAWINGS

The invention may be further understood by reference to the drawings wherein:

FIG. 1 shows apparatus for mounting a solid-state laser light source within an optical mounting tube;

FIG. 2 shows apparatus for positioning a metal-mounted convergent lens on the optical axis of an optical mounting tube; and FIGS. 3 and 4 show light source modules provided in accordance with the invention.

DETAILED DESCRIPTION

While essentially any conventional glass and metal materials could in principle be used to fabricate light source modules in accordance with the invention, substantial advantages may be derived from a careful selection of these materials. More specifically, it is found that chemical and thermal compatibility between the glasses selected for the lenses and the metals selected for lens mounting and optical mounting tube components can improve device durability and optical repeatability.

The glasses preferred for use in lens manufacture are generally of the high-expansion optical type, so that desirable optical properties in combination with thermal properties appropriate for high device stability are achieved. Among the known high-expansion optical glasses which may be used for lens fabrication are glasses of alkali phosphate, alkali fluorophosphate, alkali aluminophosphate, and alkali aluminofluorophosphate type. The preferred glasses will generally have average linear thermal expansion coefficients above about $125 \times 10^{-7}/°C$. over the temperature range of 20°–300° C., more preferably in the $150–200 \times 10^{-7}/°C$. regime over that temperature range.

Particularly preferred glasses are the alkali aluminofluorophosphate glasses, optionally comprising significant proportions of divalent metal oxides, exhibiting moderate softening temperatures in combination with improved glass stability and good chemical durability. U.S. Pat. No. 4,362,819 provides specific examples of such preferred glasses. U.S. Pat. No. 4,391,915 discloses other moldable phosphate glasses useful for the production of molded lenses, while U.S. Pat. No. 4,447,550 describes glasses of lead borosilicate composition which also exhibit relatively low softening temperatures and could alternatively be used.

Specific examples of alkali aluminophosphate and aluminofluorophosphate glasses which could be used for compatible lenses in accordance with the invention are reported in Table I below. The compositions in Table I are reported in weight percent as calculated from the glass batch, and average linear coefficients of thermal expansion are reported for each of the glasses.

TABLE I

| Glass Component | Lens Glasses | | |
|---|---|---|---|
| | 1 | 2 | 3 |
| Li2O | 2.0 | 1.87 | 1.8 |
| Na2O | 5.0 | 4.44 | 4.4 |

TABLE I-continued

| Glass Component | Lens Glasses | | |
|---|---|---|---|
| | 1 | 2 | 3 |
| K2O | — | 4.22 | 4.1 |
| ZnO | — | 18.0 | 14.3 |
| CaO | — | 3.76 | 3.7 |
| BaO | 20.1 | 10.3 | 10.1 |
| Sb2O3 | — | 12.4 | — |
| PbO | 24.2 | — | 16.6 |
| Al2O3 | 5.2 | 0.5 | 1.3 |
| P2O5 | 39.2 | 44.5 | 43.6 |
| F | 4.3 | — | — |
| Thermal Expansion Coefficient (20–300° C.) | $150 \times 10^{-7}$ | $158 \times 10^{-7}$ | $161 \times 10^{-7}$ |

Compatibility between the selected lens glass and the metal materials making up structural components of the source module in general requires reasonably good thermal expansion matching between the glass forming the lens and at least the metal lens mounting to be attached to the optical mounting tube. Based on present data, the difference in coefficient of expansion between these material should not exceed about 50 "points", ie., a difference not exceeding $50 \times 10^{-7}/°C$. between the average expansion coefficients of the materials in the 20°–300° C. range. More preferably, a maximum difference of 30 points will be maintained.

These expansion differentials are somewhat larger than would appear to be acceptable for the normal sealing of glasses to metals. However, effects such as the high degree of non-linearity in the thermal expansion behavior of the present glasses and/or a moderation in the glass/metal cooling stresses arising in these lens assemblies due to the relatively low set points of those glasses, tend to reduce the peak stresses developed. Thus the above-disclosed expansion differentials do in fact provide a useful guide to the selection of appropriate metals and glasses in these composition systems.

Among the metals which are preferred for providing the metal lens mounting and other components of the light source module of the invention are the austenitic stainless steels. These metals not only have thermal expansion coefficients in the same range as high expansion alkali phosphate optical glasses but also exhibit good sealing compatibility therewith. In addition, they are highly resistant to corrosion in use, and are readily weldable and machinable by conventional methods.

Other metals can be substituted for the preferred stainless steel components, although the thermal properties of such other metals may be slightly less favorable for precision transmitters than the preferred steels. Examples of such other metals include the 400 series stainless steels and brass.

Table II below sets forth examples of metals which could be used for the mounting tube and lens mounting for the module, although such examples are intended to be merely illustrative of the wide range of metals which could be used.

TABLE II

| Metal | Thermal Expansion | Composition |
|---|---|---|
| 304L stainless steel (austenitic) | $178 \times 10^{-7}$ | Fe + 2.0 Mn, 1.0 Si, 18–20 Cr, 8–12 Ni. |
| Inconel 718 nickel-steel | $142 \times 10^{-7}$ | Fe + 50–55 Ni, 17–21 Cr, 4.75–5.4 Nb + Ta, 2.8–3.0 Mo. |

TABLE II-continued

| Metal | Thermal Expansion | Composition |
|---|---|---|
| alloy | | |
| cold-rolled steel | 135 × 10−7 | Fe + 0.06 C, 0.38 Mn. |
| 420 stainless steel | 108 × 10−7 | Fe + 12-14 Cr, 1.0 Mn, 1.0 Si, 0.15 C. |
| Cartridge brass | 199 × 10−7 | 70 Cu, 30 Zn. |

Conventional sealing or press mounting techniques may be utilized to seal convergent lenses made of the preferred high expansion glasses above described to metal lens mountings made from the above metals. However, the preferred practice is to seal the lens directly into a central aperture in a ring- or disk-shaped mounting of the selected metal as the lens is being pressed into its final optical configuration during manufacture. U.S. Pat. No. 4,891,053 describes one such method for sealing; another and more preferred method, however, is described in copending, commonly assigned patent application Ser. No. 07/785,467, filed Oct. 31, 1991 for a "Molded Lens with Integral Mount and Method", which is expressly incorporated herein by reference for a description of that method.

The attachment of the semiconductor laser package and mounted lens to the optical mounting tube is best achieved by welding, more particularly by laser welding. Welding is desirable not only from the aspect of permitting design simplicity in the parts to be joined, but also to help to assure device stability under a wide range of different temperature, humidity, and other operating conditions.

A procedure for fabricating a laser light source module in accordance with the invention may be more fully understood by reference to the drawings, as described in the following illustrative Example. The drawings are schematic cross-sectional views of module components and suitable tooling for module fabrication offered for purposes of explanation only, and are not in true proportion or to scale.

Example

With reference to FIG. 1 of the drawings, there is first provided a fixture 8 incorporating an annular protruding portion 8a on a flat horizontal base, that portion forming a raised cylinder adapted for insertion into a metal optical mounting tube 10. Optical mounting tube 10, consisting in this Example of a right circular cylinder of type 304 L austenitic stainless steel, has an outer diameter of about 10 millimeters, an inner diameter of about 9 millimeters, and a height of about 5 millimeters.

After the mounting tube has been positioned on the fixture, a metal-mounted semiconductor laser diode 20 is inserted into the top or open end of the mounting tube, that end of the tube being referred to for reference as the source end. Laser diode 20, which incorporates an active laser emitter 22, is set firmly on protrusion 8a of the fixture, with emitter 22 being directed toward the base thereof. Laser diode 20 suitably comprises a laser diode such as a Toshiba TOLD-9211 laser diode, commercially sold by Toshiba America Electronic Components, Inc. of Irvine, Calif.

When laser diode 20 is positioned as shown, the emitter falls substantially on center axis 12 of the mounting tube. Further, the height of projection 8a is such that a preselected spacing 16 is obtained between active laser junction 22 and end face 18 at the bottom of mounting tube 10. This bottom end of the tube is hereinafter referred to as the output end of the tube, since it is the end from which collimated laser light will be emitted.

As will be apparent from the drawing, the height of projection 8a can be easily set to control distance 16, ie., the relative position of laser junction 22 along tube center axis 12, in order to obtain accurate and repeatable spacing of the emitter from the output end of the tube. Stated differently, fixture 8 transfers reference surface 18 (the tube endface) to the base of diode 20, endface 18 subsequently providing the surface to which the collimating lens will be referenced.

After laser diode 20 has been positioned in the bore of tube 10, it is permanently attached to the inner side wall of the tube at attachment points lying on sidewall/diode interface 14. Preferably, this attachment is by means of laser welding through the wall of the tube. Of course, this laser welding step is carried out with sufficient care that only negligible shifts occur in the relative positions of the tube and diode during the attachment.

Optical mounting tube 10 with attached solid state laser 20 is next removed from fixture 8 and, as shown in FIG. 2 of the drawing, set on a horizontally disposed lens assembly which rests on an optical bench 40. More specifically, tube output endface 18 of tube 10 is set on metal lens mounting 30, this lens mounting having a central aperture into which is sealed a convergent glass lens 32.

In this example, metal lens mounting 30 is composed of Type 304 L austenitic stainless steel, and has a thickness of about 1 mm, an outer diameter of about 10 mm, and an inner or aperture diameter of about 3 mm. The glass lens is an aspheric lens composed of an alkali aluminofluorophosphate optical glass having a composition, in weight percent, of about 39.2 P205, 5.0 Na20, 4.3 F, 24.2 PbO, 20.1 BaO, 2.0 Li20, and 5.2 Al203.

With the end face of optical mounting tube 18 in proximity to lens mounting 30, the lateral (x-y) position of the mounting tube with respect to the lens is adjusted to bring the optical axis of lens 32 into close alignment with the bore axis 12 of the mounting tube on which laser emitter 22 has been positioned. Thus bore axis 12 becomes the optical axis of the device.

Best alignment of lens 32 with emitter 22 is achieved by a procedure wherein laser diode 20 is activated to emit a beam of laser light 24, and the position of the laser and tube adjusted to achieve alignment of the beam with the optical axis of the device. In the illustrative apparatus shown, beam 24 transverses lens 32, exiting the assembly downwardly in a direction along bore axis 12 and through an aperture in the platform of the optical bench to intersect a 45-degree mirror 26 on the path of beam 24. The beam is then reflected by mirror 26 toward a remote target 28 on which the light beam from the laser 20 may be observed. As will be apparent, the use of the 45-degree mirror to redirect the beam is simply a convenience to effect a folding of the beam path; a straight vertical or horizontal beam path to an appropriately located remote target could alternatively be used.

To achieve final alignment of the beam with respect to mounting tube 10, the tube together with diode 20 are moved laterally with respect to lens mount 30 and lens 32 to adjust the location of the image of emitter 22 on target 28. In this way accurate and repeatable alignment of the laser 20 and lens 32 on optical (bore) axis 12 of the assembly may be achieved. After alignment of the tube 10 and lens mounting 30 has been achieved, the lens mounting and lens are permanently attached to the mounting tube by means such as laser welding, thus permanently fixing the desired alignment.

It is possible, and normally desirable for most repeatable module performance where laser welding is employed, to achieve a final adjustment of the focal point of the device as laser welding of the mounting tube to the lens mounting is carried out. This is done by slightly separating tube endface 18 from lens mounting 30 just prior to welding (a distance on the order of only a few microns), to achieve slight defocusing of the image of emitter 22 on target 28. This will compensate for weld consolidation, ie., the shrinkage of the weld and proximate portions of the tube and mounting which normally occurs as the weld is cooled. A finished source module provided in accordance with the Example is shown in FIG. 3 of the drawing. An alternative construction, described above and shown in FIG. 4 of the drawing, places light source 20 on the endface of mounting tube 10, with lens 32 and its mount being positioned within the tube for attachment to the tube sidewall.

The performance advantages of laser light source modules provided utilizing the preferred materials and structure shown and above described are several. First, because of the balanced thermal expansion characteristics of the austenitic stainless steel mounting components and the preferred alkali fluorophosphate lens glasses (including the desirable relationship between lens refractive characteristics and temperature), the source module exhibits substantial independence from temperature effects which otherwise degrade high or low temperature device operation. Hence the expansion of the mounting tube is sufficiently compatible with dimensional changes in the lens that only minor changes in beam output are observed to result from changes in the temperature of the device.

Of course, while the invention disclosed herein has been described with respect to specific materials and specific procedures applicable to the fabrication of improved collimated laser light source modules in accordance therewith, it will be recognized that those materials and procedures are presented for purposes of illustration only and are not intended to be limiting. Thus numerous modifications and variations upon the compositions, structures, and processes specifically described herein will doubtless be resorted to by those skilled in the art within the scope of the appended claims.

We claim:

1. A light source module for generating collimated laser light which comprises:
   a stainless steel optical mounting tube having a bore, a tube sidewall, and opposing tube endfaces;
   a single convergent glass lens sealed to a stainless steel lens mounting, the glass lens being composed of a high-expansion optical glass having an average linear thermal expansion coefficient above $125 \times 10^{-7}/°C.$, the mounting and lens being affixed to the optical mounting tube at a first end and at a location positioning the lens on a central axis of the bore, and the glass lens and metal lens mounting having a difference in thermal expansion coefficient not exceeding about $50 \times 10^{-7}/°C.$;
   a solid-state laser light source affixed to the optical mounting tube at a second end thereof;
   at least one of the lens and light source being attached to the mounting tube at points on or proximate to the tube sidewall and the other of the lens and light source being attached to the tube at points on or proximate to the tube endface;
   whereby thermal changes in light source location or lens focal parameters are offset by dimensional changes in the stainless steel components of the module.

2. A light source module in accordance with claim 1 wherein the optical mounting tube is a one-piece cylindrical metal tube and wherein the optical axis of the lens coincides with the central axis of the mounting tube.

3. A light source module in accordance with claim 2 wherein the solid state light source is a laser diode source element having a light-emitting region disposed on the lens optical axis and within the source end of the tube.

4. A light source module in accordance with claim 3 wherein the source element is bonded to the tube at one or more points on or proximate to the tube sidewall of the tube.

5. A light source module in accordance with claim 4 wherein the convergent lens and metal lens mounting are sealed to the tube at one or more points on or proximate to the tube endface at the output end of the tube.

6. A light source module in accordance with claim 1 wherein the high expansion optical glass is selected from the group consisting of alkali phosphate, alkali fluorophosphate, alkali alumino-phosphate, and alkali aluminofluorophosphate glasses having average linear coefficient of thermal expansion of at least about $125 \times 10^{-7}/°C.$ over the temperature range of $20°-300°$ C.

7. A light source module in accordance with claim 6 wherein the high expansion optical glass is an alkali aluminofluorophosphate glass having an average linear coefficient of thermal expansion in the range of about $150-200 \times 10^{-7}/°C.$ over the temperature range of $20°-300°$ C.

8. A light source module in accordance with claim 7 wherein the optical mounting tube is composed of a metal selected from the group consisting of austenitic stainless steels and 400 Series stainless steels.

9. A method for making a light source module which comprises the steps of:
   providing a stainless steel optical mounting tube having a tube sidewall, opposing tube endfaces, and a longitudinal bore;
   placing a solid-state laser light source having an active laser junction within the bore at a first end of the mounting tube, placement being such that the junction is positioned on or proximate to a central bore axis within the tube, and at a preselected distance from the output end;
   fastening the light source to the tube sidewall;
   placing a second end of the tube on a stainless steel lens mounting, the lens mounting having a central aperture within which is sealed a single convergent glass lens composed of a high expansion optical glass having a central optical axis;
   positioning the mounting tube with respect to the lens mounting such that the optical axis of the lens is substantially congruent with the bore axis;
   slightly separating the mounting tube from the lens mounting; and
   welding the mounting tube to the lens mount.

10. A method in accordance with claim 9 wherein the source element is welded to the tube at one or more points on or proximate to the inner sidewall of the tube.

11. A method in accordance with claim 9 wherein the convergent lens is formed of a high expansion optical glass selected from the group consisting of alkali phosphate, alkali fluorophosphate, alkali alumino-phosphate, and alkali aluminofluorophosphate glasses having average linear coefficient of thermal expansion of at least about $125 \times 10^{-7}$/°C. over the temperature range of 20°–300° C.

12. A method in accordance with claim 11 wherein the high expansion optical glass is an alkali aluminofluorophosphate glass having an average linear coefficient of thermal expansion in the range of about $150$–$200 \times 10^{-7}$/°C. over the temperature range of 20°–300° C.

13. A method in accordance with claim 11 wherein the optical mounting tube is composed of a metal selected from the group consisting of austenitic stainless steels and 400 Series stainless steels.

14. A light source module for generating collimated laser light which comprises:
- a metal optical mounting tube composed of austenitic stainless steel and having a bore, a tube sidewall, and opposing tube endfaces;
- a single convergent glass lens sealed to a metal lens mounting, the mounting and lens being affixed to the optical mounting tube at a first end of the tube with the lens on a central axis of the bore, the glass lens being composed of a high expansion optical glass selected from the group consisting of alkali phosphate, alkali fluorophosphate, alkali aluminophosphate, and alkali fluoroaluminophosphate glasses having an average linear thermal expansion coefficient in the range of $150$–$200 \times 10^{-7}$/°C. over the temperature range of 20°–300° C.; and
- a solid-state laser light source affixed to the optical mounting tube at a second end thereof; and wherein:

the light source is attached to the mounting tube at points on or proximate to the tube sidewall;

the lens is attached to the tube at points on or proximate to the tube endface;

the convergent glass lens is formed of a high expansion optical glass; and the module exhibits substantial independence from beam output changes due to temperature effects.

* * * * *

UNITED STATES PATENT AND TRADEMARK OFFICE
CERTIFICATE OF CORRECTION

PATENT NO.  : 5,418,700
DATED       : May 23, 1995
INVENTOR(S) : Jeffery A. DeMeritt and Mark L. Morrell It is certified that error appears in the above-indentified patent and that said Letters Patent is hereby corrected as shown below:

Col. 9, line 15, "11" should be "9"

Signed and Sealed this

Third Day of October, 1995

Attest:

BRUCE LEHMAN

Attesting Officer    Commissioner of Patents and Trademarks